US008969788B2

(12) United States Patent
Zheng et al.

(10) Patent No.: US 8,969,788 B2
(45) Date of Patent: Mar. 3, 2015

(54) SELF-REGISTERED COMB LASER SOURCE

(71) Applicant: Oracle International Corporation, Redwood City, CA (US)

(72) Inventors: Xuezhe Zheng, San Diego, CA (US); Ying L. Luo, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 259 days.

(21) Appl. No.: 13/717,339

(22) Filed: Dec. 17, 2012

(65) Prior Publication Data

US 2014/0166864 A1      Jun. 19, 2014

(51) Int. Cl.
*H01L 31/16*      (2006.01)
(52) U.S. Cl.
CPC ..................... *H01L 31/16* (2013.01)
USPC ........................ 250/227.23; 385/37
(58) Field of Classification Search
USPC ................... 250/227.23; 385/11, 14, 37
See application file for complete search history.

(56) References Cited

U.S. PATENT DOCUMENTS

| | | | | |
|---|---|---|---|---|
| 6,097,863 A * | 8/2000 | Chowdhury | ................... | 385/37 |
| 6,657,723 B2 * | 12/2003 | Cohen et al. | ................ | 356/328 |
| 2007/0086703 A1 * | 4/2007 | Kirk et al. | ....................... | 385/37 |
| 2010/0296812 A1 * | 11/2010 | Asghari | ........................ | 398/82 |

OTHER PUBLICATIONS

Scott, R. P. et al. "3.5-THz Wide, 175 Mode Optical Comb Source" 2007 Optical Society of America, OSA 1-55752-830-6.
Fang, Alexander et al. "A Distributed Bragg Reflector Silicon Evanescent Laser" IEEE Photonics Technology Letters, vol. 20 No. 20, Oct. 15, 2008. 1041-1135/$25.00 2008 IEEE.
Krishnamoorthy, Ashok V. et al. "Exploiting CMOS Manufacturing to Reduce Tuning Requirements for Resonant Optical Devices", IEEE Photonics Journal, Exploiting CMOS Manufacturing, vol. 3, No. 3, Jun. 2011, p. 567-579.
Krishnamoorthy, Ashok V. et al. "Computer Systems Based on Silicon Photonic Interconnects", Proceedings of the IEEE vol. 97, No. 7, Jul. 2009.
Sanjoh, Hiroaki, et al. "Multiwavelength Light Source with Precise Frequency Spacing Using a Mode-Locked Semiconductor Laser and an Arrayed Waveguide Grating Filter" IEEE Photonics Technology Letters, vol. 9. No. 6, Jun. 1997.

(Continued)

*Primary Examiner* — Tony Ko
(74) *Attorney, Agent, or Firm* — Park, Vaughan, Fleming & Dowler LLP; Steven E. Stupp

(57) ABSTRACT

An integrated optical source is described. This optical source outputs one or more optical signals that provide a comb of wavelengths for use in wavelength-division-multiplexing (WDM) optical interconnects or links. In particular, a shared echelle grating is used as a wavelength-selective filter or control device for multiple lasing cavities to achieve self-registered and accurate lasing-channel spacing without inter-channel gain competition. Furthermore, the optical source can be used to provide all the wavelength channels in one optical waveguide or in separate optical waveguides. Therefore, the optical source may be used with cascaded ring-resonator modulators and/or electro-absorption-based broadband modulators.

20 Claims, 5 Drawing Sheets

(56) References Cited

OTHER PUBLICATIONS

Fujioka, Nobuhide et al. "Compact and Low Power Consumption Hybrid Integrated Wavelength Tunable Laser Module Using Silicon Waveguide Resonators", Journal of Lightwave Technology, vol. 28, No. 21, Nov. 1, 2010.

Delfyett, Peter J. et al. "Optical Frequency Combs from Semiconductor Lasers and Applications in Ultrawideband Signal Processing and Communications", Journal of Lightwave Technology, vol. 24, No. 7, Jul. 2006.

Kovsh, A. et al. "Quantum dot laser with 75nm broad spectrum of emission", 2007 Optical Society of America, Apr. 1, 2007/vol. 32, No. 7/ Optical Letters.

Wojcik, Gregory L. "A single comb laser source for short reach WDM interconnects", Proc. of SPIE vol. 7230 72300M-1, 2009 SPIE.

Zheng, Xuezhe et al. "Ultralow Power 80 Gb/s Arrayed CMOS Silicon Photonic Transceivers for WDM Optical Links", Journal of Lightwave Technology, vol. 30, No. 4, Feb. 15, 2012, 0733-8724/$26.00 2011 IEEE.

* cited by examiner

SELF-REGISTERED COMB LASER SOURCE

GOVERNMENT LICENSE RIGHTS

This invention was made with United States government support under Agreement No. HR0011-08-9-0001 awarded by DARPA. The United States government has certain rights in the invention.

BACKGROUND

1. Field

The present disclosure relates to techniques for communicating optical signals. More specifically, the present disclosure relates to an integrated circuit that includes an optical source.

2. Related Art

Silicon photonics is a promising technology that can provide large communication bandwidth, low latency and low power consumption for inter-chip and intra-chip connections. In the last few years, significant progress has been made in developing low-cost components for use in inter-chip and intra-chip silicon-photonic connections, including: high-bandwidth efficient silicon modulators, low-loss optical waveguides, wavelength-division-multiplexing (WDM) components, and high-speed CMOS optical-waveguide photodetectors. However, producing a suitable low-cost WDM optical source remains a challenge and poses an obstacle to implementing WDM silicon-photonic links.

The WDM optical source configuration often depends on the type of modulators used and the silicon-photonic-link architecture. For example, with electro-absorption-based broadband modulators, the WDM optical source typically needs the wavelength channels separated into different optical waveguides. Alternatively, when cascaded ring-resonator modulators are used, a WDM optical source with all the wavelength channels multiplexed in one optical waveguide is usually preferred. In both cases, the wavelength channels need to have accurate wavelength registration and channel spacing. Typically, a conventional laser source (such as a laser diode) generates a single wavelength. In order to achieve the wavelength requirements for WDM transmission, each laser source usually uses closed-loop wavelength control based on feedback from a free-space etalon filter. Moreover, the multiple laser sources, which are locked to a different wavelength grid, are then used together for a WDM link. As a consequence, laser sources for use in WDM transmission tend to be very expensive and bulky. Furthermore, it can be very difficult to integrate these discret laser sources on to silicon chips, and because future processing nodes may involve thousands (or more) optical channels, the cost of the laser sources may be prohibitive.

In an alternative approach, a single broad-spectrum light emitter may be used instead of an array of single-wavelength laser sources. For example, the broad-spectrum light emitter may include: a superluminescent diode, a broadband laser, and a mode-locked comb laser. However, because of size, cost and power-consumption limitations, none of these optical sources offers a low-cost solution for a multi-wavelength WDM laser source.

Hence, what is needed is an integrated optical source without the above-described problems.

SUMMARY

One embodiment of the present disclosure provides an optical source that includes: a first mirror that at least partially reflects a first optical signal having multiple wavelengths; a first optical waveguide, optically coupled to the first mirror, that conveys the first optical signal; a wavelength-control device, and optical paths optically coupled to the wavelength-control device. The wavelength-control device includes: a first optical port that couples to the first optical waveguide; a propagation region that conveys the first optical signal; and an optical device that images and diffracts the first optical signal using a reflective geometry in one propagation direction, and that images and diffracts second optical signals having the wavelengths using the reflective geometry in another propagation direction, where a given second optical signal has a given wavelength. Moreover, the wavelength-control device includes second optical ports, optically coupled to diffraction orders of the optical device, that convey the second optical signals having the wavelengths, where a given second optical port provides the given second optical signal. Furthermore, the optical paths (which are optically coupled to the second optical ports) include: second optical waveguides that convey the second optical signals, optical gain mechanisms that amplify the second optical signals, and second mirrors that at least partially reflect the second optical signals.

Additionally, a given optical path may include: a given second optical waveguide optically coupled to a given second optical port, that conveys the given second optical signal; a given optical gain mechanism, optically coupled to the given second optical waveguide, that amplifies the given second optical signal; and a given second mirror, optically coupled to the given second optical waveguide, that at least partially reflects the given second optical signal.

In some embodiments, the optical paths include optical phase-tuning mechanisms, where a given optical phase-tuning mechanism is optically coupled to the given second optical waveguide and adjusts a phase of the given second optical signal. Note that the optical phase-tuning mechanisms may have a different band gap than that of the optical gain mechanisms. Furthermore, the optical phase-tuning mechanisms may include heaters that modify temperatures of the optical phase-tuning mechanisms.

Moreover, the first mirror and/or the second mirrors may include a distributed Bragg reflector. Alternatively or additionally, the first mirror may include a metal disposed on a surface of the first optical waveguide and/or the second mirrors may include metal disposed on surfaces of the second optical waveguides.

Furthermore, the optical gain mechanisms may receive electrical currents to electrically pump the second optical signals.

In some embodiments, the optical source outputs the first optical signal at the first mirror. In these embodiments, the optical source may include cascaded ring-resonator modulators, optically coupled to the first mirror, that modulate the wavelengths in the first optical signal. Alternatively or additionally, the optical source outputs the second optical signals at the second mirrors. In these embodiments, the optical source may include optical modulators, optically coupled to the second mirrors, that modulate the wavelengths in the second optical signals.

Note that an incidence angle associated with a given diffraction order of the optical device may be different than a diffraction angle associated with the given diffraction order. Moreover, the optical device may include a diffraction grating on a curved surface. For example, the optical device may include an echelle grating.

In some embodiments, the optical device includes: a substrate; a buried-oxide layer disposed on the substrate; and a semiconductor layer disposed on the buried-oxide layer, where the first optical waveguide, the second optical waveguides and/or the wavelength-control filter are included in the semiconductor layer. Moreover, the substrate may include a semiconductor, such as silicon. Note that the optical gain mechanisms may include at least a different semiconductor than that in the semiconductor layer.

Another embodiment provides a system that includes the optical source.

Another embodiment provides a method for amplifying the optical signals, which may be performed by the optical source. Using the first mirror, the first optical signal having multiple wavelengths is at least partially reflected. Then, the first optical signal is conveyed in the first optical waveguide. Moreover, in one propagation direction, the first optical signal is imaged and diffracted using the optical device in the wavelength-control device to de-multiplex the first optical signal into the second optical signals having the wavelengths, where the given second optical signal has the given wavelength. Furthermore, in the other propagation direction, the second optical signals are imaged and diffracted using the optical device to multiplex the second optical signals into the first optical signal. Also, the second optical signals are conveyed in the second optical waveguides, where the given second optical waveguide conveys the given second optical signal. Next, the second optical signals are amplified using the optical gain mechanisms optically coupled to the second optical waveguides, where the given optical gain mechanism amplifies the given second optical signal. Additionally, the second optical signals are at least partially reflected using the second mirrors, where the given second mirror at least partially reflects the given second optical signal.

Figure 1:
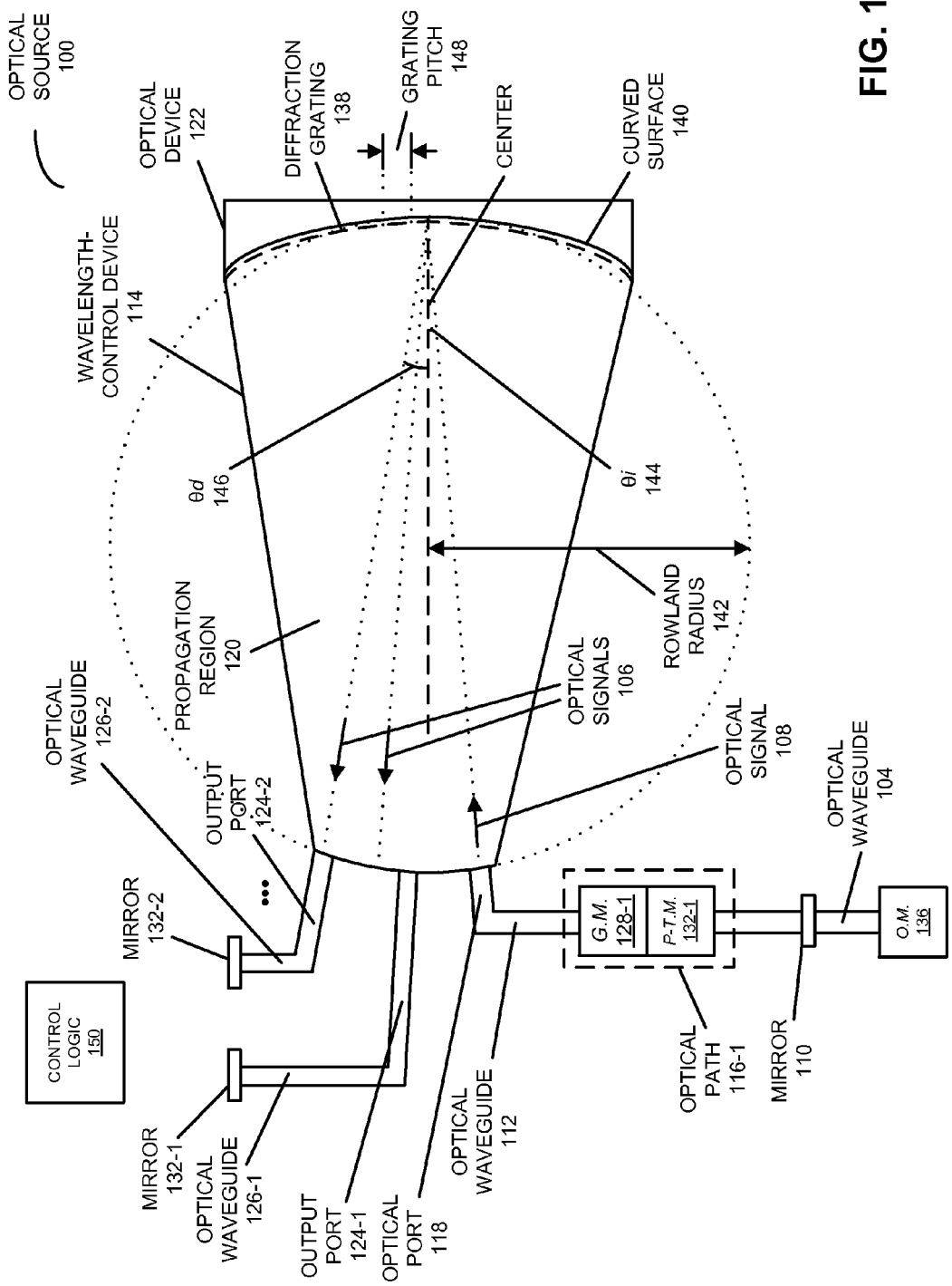
FIG. 1 is a block diagram illustrating an optical source in accordance with an embodiment of the present disclosure.

Table 1 provides design parameters for an echelle grating in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of an optical source, a system that includes the optical source, and a method for amplifying optical signals are described. This integrated optical source may output one or more optical signals that provide a comb of wavelengths for use in wavelength-division-multiplexing (WDM) optical interconnects or links. In particular, a shared echelle grating is used as a wavelength-selective filter or control device for multiple lasing cavities to achieve self-registered and accurate lasing-channel spacing without inter-channel gain competition. Furthermore, the optical source can be used to provide all the wavelength channels in one optical waveguide or in separate optical waveguides. Therefore, the optical source may be used with cascaded ring-resonator modulators and/or electro-absorption-based broadband modulators.

This low-cost WDM optical source may facilitate WDM silicon-photonic links, thereby significantly improving the performance of the optical interconnects (such as the bandwidth density and the power consumption) and computing systems that include the optical interconnects.

We now describe embodiments of the optical source. FIG. 1 presents a block diagram illustrating an optical source 100. This optical source includes: a mirror 110 (such as a distributed Bragg reflector or metal disposed on an end surface of optical waveguide 112) that at least partially reflects optical signal 108 having multiple wavelengths; optical waveguide 112, optically coupled to mirror 110, that conveys optical signal 108; a wavelength-control device 114 that defines lasing wavelengths, and optical paths 116 optically coupled to wavelength-control device 114. Wavelength-control device 114 includes: an optical port 118 that couples to optical waveguide 112; a propagation region 120 that conveys optical signal 108; and an optical device 122 that images and diffracts optical signal 108 using a reflective geometry in one propagation direction, and that images and diffracts optical signals 106 having the wavelengths using the reflective geometry in another propagation direction, where a given one of optical signals 106 has a given wavelength. Moreover, wavelength-control device 114 includes optical ports 124, optically coupled to diffraction orders of optical device 122, that convey optical signals 106 having the wavelengths, where a given one of optical ports 124 provides the given one of optical signals 106.

Furthermore, optical paths 116 (which are optically coupled to optical ports 124) include: optical waveguides 126 that convey optical signals 106, optical gain mechanisms (G.M.) 128 that amplify optical signals 106, and mirrors 132 that at least partially reflect optical signals 106 (such as distributed Bragg reflectors or metal disposed on end surfaces of optical waveguides 126). For example, during operation of optical source 100, optical gain mechanisms 128 may receive electrical currents to electrically pump optical signals 106.

Additionally, a given optical path (such as optical path 116-1) may include: a given one of optical waveguides 126 (such as optical waveguide 126-1) optically coupled to a given optical port (such as optical port 124-1), that conveys the given one of optical signals 106; a given optical gain mechanism (such as optical gain mechanism 128-1), optically coupled to the given one of optical waveguides 126, that amplifies the given one of optical signals 106; and a given mirror (such as mirror 132-1), optically coupled to the given one of optical waveguides 126, that at least partially reflects the given one of optical signals 106.

In some embodiments, optical paths 116 include optional optical phase-tuning mechanisms (P-T.M.) 132, where a given optical phase-tuning mechanism (such as optical phase-tuning mechanism 132-1) is optically coupled to the given one of optical waveguides 126 and adjusts a phase of the given one of optical signals 106. These optional optical phase-tuning mechanisms 132 may be used to fine-tune one or more of the cavity modes so that they are aligned with the center wavelength of the echelle grating to improve the lasing performance.

Note that optional optical phase-tuning mechanisms 132 may have a different or the same band gap than that of optical gain mechanisms 128. For example, optical gain mechanisms 128 may include a III-V semiconductor or germanium and optional optical phase-tuning mechanisms 132 may include silicon. These components may be wafer bonded to each other, edge coupled, or surface-normal coupled. Alternatively, optional optical phase-tuning mechanisms 132 may be included in optical gain mechanisms 128. Note that optional optical phase-tuning mechanisms 132 may align optical cavity modes with peak wavelengths of wavelength-control device 114.

Moreover, optional optical phase-tuning mechanisms 132 may include heaters (not shown) that modify temperatures of optical phase-tuning mechanisms 132. Alternatively or additionally, optional optical phase-tuning mechanisms 132 may use carrier-based index modulation (such as PIN forward injection).

As shown in FIG. 1, optical source 100 may output optical signal 108 at mirror 110 (by specifying the reflectivity of mirror 110). In these embodiments, optical source 100 may include optical modulator (O.M.) 136 (such as cascaded ring-resonator modulators), optically coupled to mirror 110 by optical waveguide 104, that modulates the wavelengths in optical signal 108 outside of the optical cavities (so as to avoid introducing additional optical losses). The resulting output optical signal may be conveyed on optical waveguide 104 or an optical fiber (not shown). Moreover, as discussed further below, optical signal 108 may be associated with a predefined channel spacing (such as those used in WDM).

In some embodiments, optical device 122 may include a diffraction grating 138 on a curved surface 140 having a radius of twice Rowland radius 142, such as an echelle grating. Thus, an incidence angle ($\theta_i$) 144 associated with a diffraction order may be different than a diffraction angle ($\theta_d$) 146 associated with the diffraction order. Moreover, a grating pitch 148 of diffraction grating 138 may be greater than or equal to 20 μm and/or Rowland radius 142 may be less than 1 mm.

Note that an echelle grating separates or combines multiple wavelength signals with one shared grating structure. Effectively, an echelle grating integrates multiple wavelength filters together. With an appropriate arrangement of optical waveguides 112 and 126, accurate and uniform channel spacing can be achieved using a grating pitch 148 that is based on effective index of refraction of propagation region 120 (such as that of silicon).

Using an echelle grating as an integrated multi-channel wavelength filter (i.e., wavelength-control device 114), a multi-wavelength laser source with a self-registered channel spacing can be implemented. As depicted in FIG. 1, an echelle grating has one input optical waveguide (optical waveguide 112) and multiple output optical waveguides (optical waveguides 126) filtering out different wavelength channels coming from the input optical waveguide. Mirrors 110 and 132 define ends of optical cavities. Then, by including an active gain medium (such as one of optical gain mechanisms 128) and optional optical phase-tuning mechanisms 132 in one of optical waveguides 126, a wavelength-specific optical cavity may be defined. Note that the echelle grating in this optical cavity may determine the lasing wavelength (such as one of wavelengths $\lambda_1$-$\lambda_8$). This may be repeated for other optical waveguides 126, thereby simultaneously establishing multiple lasing cavities.

By including each of the gain sections in optical waveguides 126, these gain sections may be dedicated to particular wavelengths by the echelle grating. This configuration may prevent multiple wavelengths sharing the same gain medium and creating mode competition that can reduce the efficiency of each sub-laser, and may also result in mode and wavelength hopping. Furthermore, by separating the gain sections, a particular laser wavelength can be electrically turned off by not pumping carriers (via an electrical current) into the corresponding gain section. This is because each of the lasing wavelengths in the comb are independent of each other and have separate gain sections so that only the wavelengths necessary for operation at a given time need to be created. In this way, the efficiency can be increased and the total power consumption can be decreased.

Additionally, the spacing of the wavelengths (i.e., the spacing of the comb) is also controlled by the echelle grating which is common in the optical cavities. Therefore, tracking and control of the individual wavelengths in the comb with respect to each other may not be necessary because all of the wavelength channels may self-register to each other with uniform and accurate wavelength spacing.

Because of manufacturing tolerances, the absolute wavelength of the echelle grating may deviate from a target value. However, by changing the effective index of refraction of propagation region 120 using a thermal or another technique (under control of control logic 150), all of the wavelength channels can be tuned simultaneously, thereby providing a tunable comb. On the other hand, to lock the lasing wavelength to a predetermined WDM wavelength grid, monitoring and control of only one wavelength channel may be needed. The remaining wavelength channels will automatically register to the controlled wavelength channel.

Figure 2:
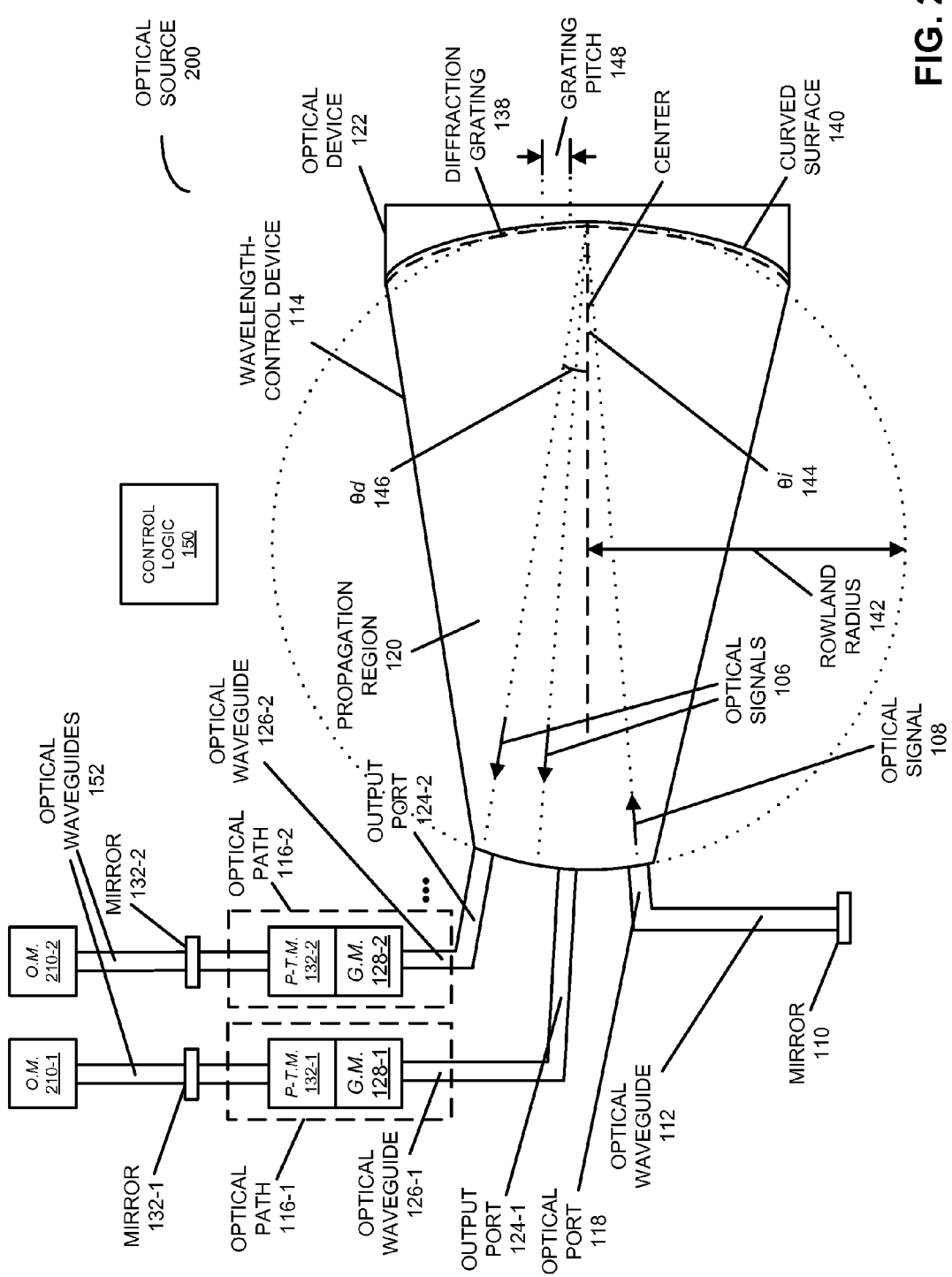
FIG. 2 is a block diagram illustrating an optical source in accordance with an embodiment of the present disclosure.

Note that the optical source may be designed so that the output is at mirror 110, mirrors 132 or both by specifying the reflectivity of mirrors 110 and/or 132. In particular, as shown in FIG. 1, if a high reflectivity is used for mirrors 132 and a lower reflectivity for mirror 110, most of optical signal 108 will emit from mirror 110, thereby providing an optical signal with a comb of wavelengths. Alternatively, if a high reflectivity is used for mirror 110 and a lower reflectivity for mirrors 132, most of optical signals 106 will emit from mirrors 132, thereby providing a set of single-wavelength optical signals. This is shown in FIG. 2, which presents a block diagram illustrating an optical source 200. In these embodiments, optical source 200 may include optical modulators (O.M.) 210 (such as electro-optical modulators or Mach-Zehnder optical modulators), optically coupled to mirrors 132 by optical waveguides 152, that modulate the wavelengths in optical signals 106 outside of the optical cavities (so as to avoid introducing additional optical losses). The resulting output optical signals may be conveyed on optical waveguides 152 or an optical fiber (not shown).

Figure 3:
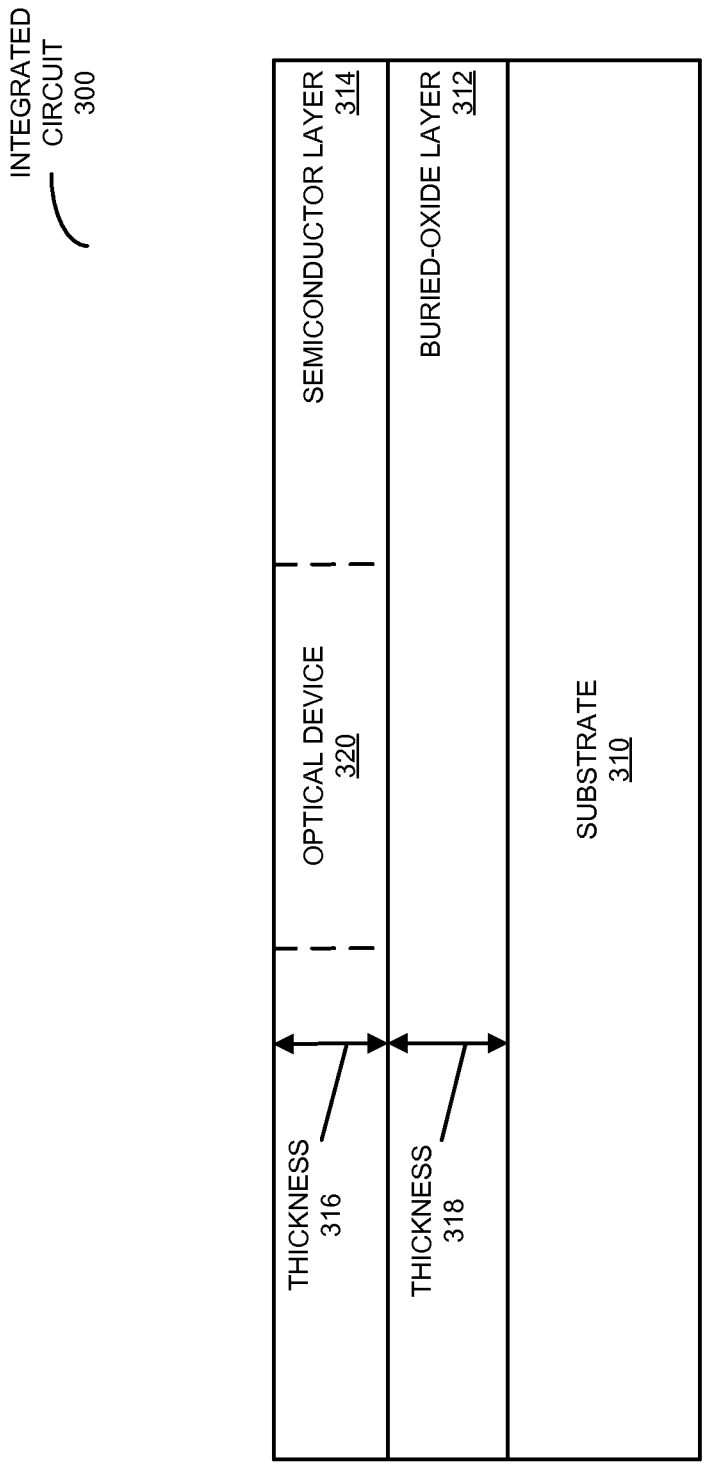
FIG. 3 is a block diagram illustrating a side view of an integrated circuit that includes the optical source of FIG. 1 or 2 in accordance with an embodiment of the present disclosure.

The preceding embodiments of the optical source may, at least in part, be implemented using silicon-on-insulator (SOI) technology. This is illustrated in FIG. 3, which presents a block diagram illustrating a side view of an integrated circuit 300 that includes optical source 100 (FIG. 1) or 200 (FIG. 2). In particular, integrated circuit 300 may include: a substrate 310; a buried-oxide layer 312 disposed on substrate 310; and a semiconductor layer 314 disposed on buried-oxide layer 312. As illustrated by optical device 320, at least optical waveguide 112 (FIGS. 1 and 2), optical waveguides 126 (FIGS. 1 and 2) and/or wavelength-control device 114 (FIGS. 1 and 2) may be included in semiconductor layer 314. Note that substrate 310 and/or semiconductor layer 314 may include a semiconductor, such as silicon. In some embodiments, optical gain mechanisms 128 (FIGS. 1 and 2) include a different semiconductor than that in semiconductor layer 314. For example, the active gain medium can be germanium epitaxially grown onto silicon, or a III-V semiconductor hybrid integrated to optical waveguides 126 (FIGS. 1 and 2) via III-V semiconductor-to-silicon wafer bonding, or III-V semiconductor to optical waveguide bonding, using butt coupling and/or surface-normal coupling.

In an exemplary embodiment, optical signals 106 and 108 have wavelengths between 1.1-1.7 μm, such as an optical signal having a fundamental wavelength of 1.3 or 1.55 μm. Moreover, semiconductor layer 314 may have a thickness 316 that is less than 1 μm (such as 0.25-0.3 μm). Furthermore, buried-oxide layer 312 may have a thickness 318 between 0.3 and 3 μm (such as 0.8 μm).

Furthermore, the parameters for an exemplary design of an echelle grating are provided in Table 1.

TABLE 1

| | |
|---|---|
| Channel count | 8 |
| Channel spacing (nm) | 1.6 |
| Optical crosstalk (dB) | 20-25 |
| Footprint (μm$^2$) | 500 × 200 |
| Insertion loss | <3 dB |
| Carrier wavelength (nm) | 1550 |
| Free spectral range (nm) | 12.8 |
| Thickness 316 (nm) | 300 |
| Diffraction order | 90 |
| Grating pitch 148 (μm) | 25 |

Figure 4:
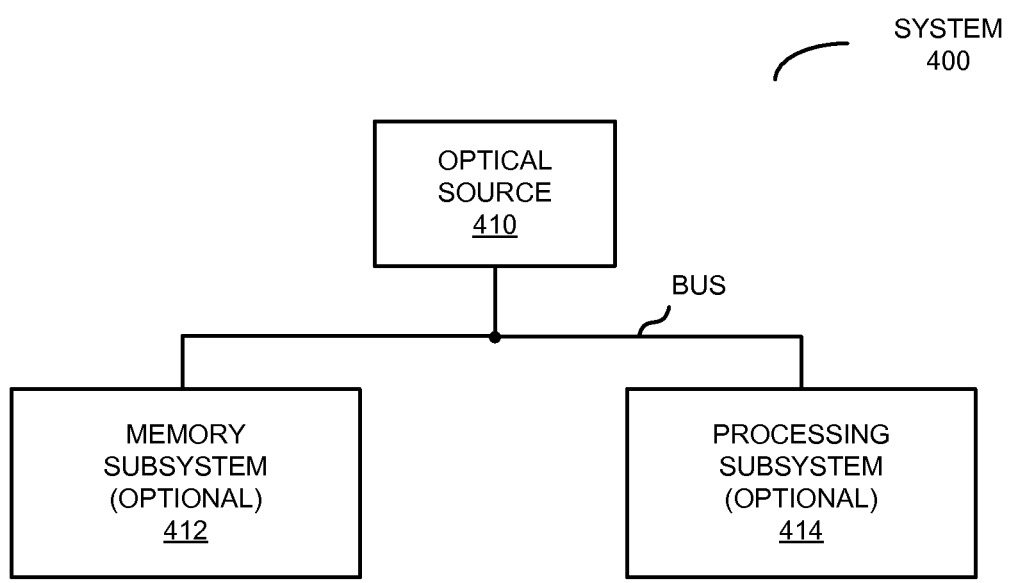
FIG. 4 is a block diagram illustrating a system that includes the optical source of FIG. 1 or 2 in accordance with an embodiment of the present disclosure.

The optical source may be used in a variety of applications. This is shown in FIG. 4, which presents a block diagram illustrating a system 400 that includes optical source 410, such as optical source 100 (FIG. 1) or 200 (FIG. 2).

In general, functions of optical source 100 (FIG. 1), optical source 200 (FIG. 2), integrated circuit 300 (FIG. 3) and system 400 may be implemented in hardware and/or in software. Thus, system 400 may include one or more program modules or sets of instructions stored in an optional memory subsystem 412 (such as DRAM or another type of volatile or non-volatile computer-readable memory), which may be executed by an optional processing subsystem 414. Note that the one or more computer programs may constitute a computer-program mechanism. Furthermore, instructions in the various modules in optional memory subsystem 412 may be implemented in: a high-level procedural language, an object-oriented programming language, and/or in an assembly or machine language. Note that the programming language may be compiled or interpreted, e.g., configurable or configured, to be executed by the processing subsystem.

Components in system 400 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 400 may be at one location or may be distributed over multiple, geographically dispersed locations.

System 400 may include: a VLSI circuit, a switch, a hub, a bridge, a router, a communication system (such as WDM communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device. Note that a given computer system may be at one location or may be distributed over multiple, geographically dispersed locations.

Moreover, the optical source can be used in a wide variety of applications, such as: optical communications (for example, in an optical interconnect or an optical link), manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

Furthermore, the embodiments of the optical source, the integrated circuit and/or the system may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed. In addition, functionality in the preceding embodiments of the optical source, the integrated circuit and/or the system may be implemented more in hardware and less in software, or less in hardware and more in software, as is known in the art.

In the preceding description, we refer to 'some embodiments.' Note that 'some embodiments' describes a subset of all of the possible embodiments, but does not always specify the same subset of embodiments.

Figure 5:
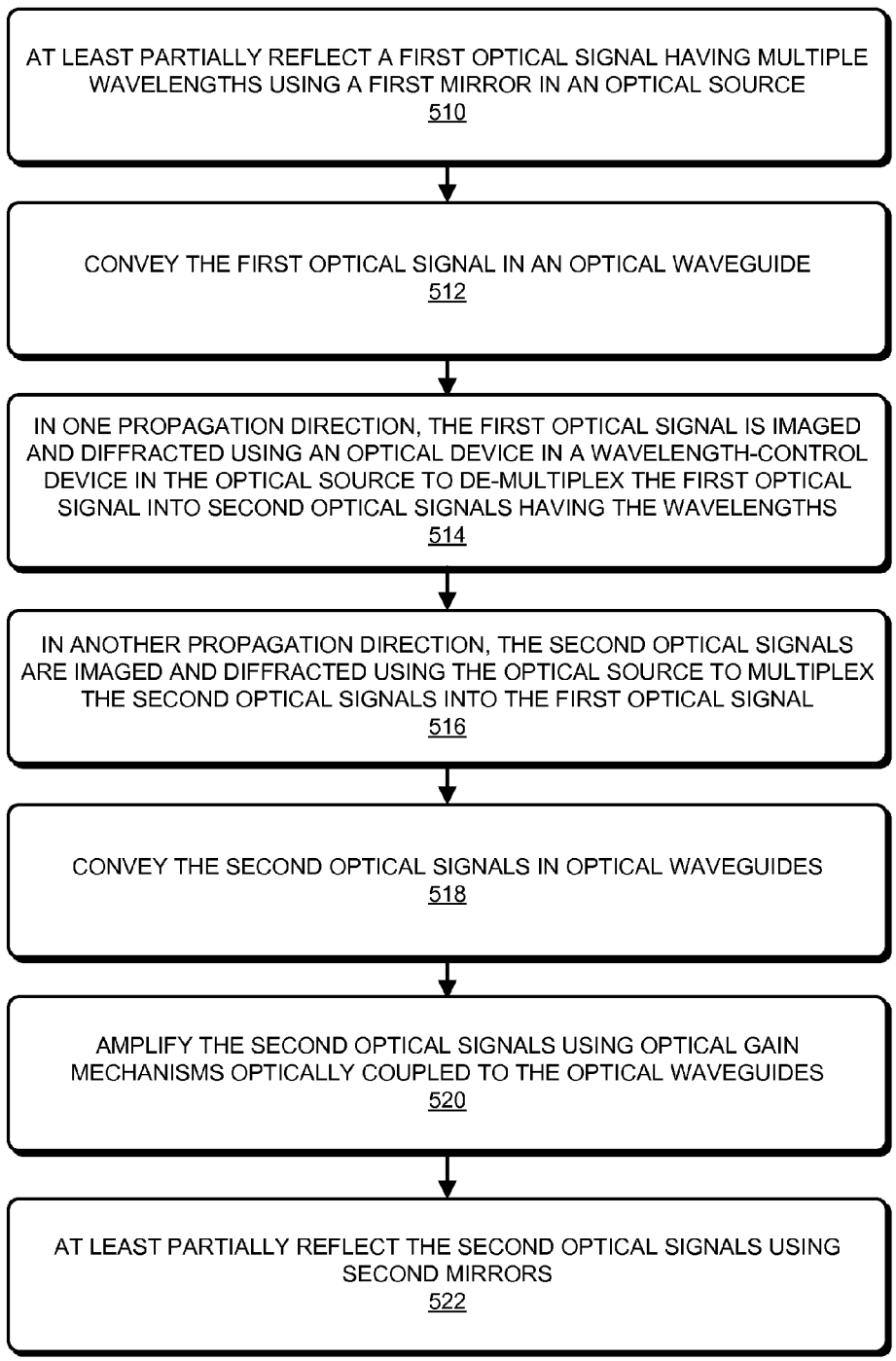
FIG. 5 is a flow chart illustrating a method for amplifying optical signals in accordance with an embodiment of the present disclosure.

We now describe embodiments of the method. FIG. 5 presents a flow chart illustrating a method 500 for amplifying optical signals, which may be performed by an optical source (such as optical source 100 in FIG. 1 or 200 in FIG. 2). During operation, using a first mirror in the optical source, a first optical signal having multiple wavelengths is at least partially reflected (operation 510). Then, the first optical signal is conveyed in a first optical waveguide in the optical source (operation 512). Moreover, in one propagation direction, the first optical signal is imaged and diffracted using an optical device in a wavelength-control device in the optical source to de-multiplex the first optical signal into second optical signals having the wavelengths (operation 514), where a given second optical signal has a given wavelength. Furthermore, in the other propagation direction, the second optical signals are imaged and diffracted using the optical device to multiplex the second optical signals into the first optical signal (operation 516).

Also, the second optical signals are conveyed in second optical waveguides in the optical source (operation 518), where a given second optical waveguide conveys a given second optical signal. Next, the second optical signals are amplified using optical gain mechanisms optically coupled to the second optical waveguides (operation 520), where a given optical gain mechanism amplifies the given second optical signal. Additionally, the second optical signals are at least partially reflected using second mirrors (operation 522), where a given second mirror at least partially reflects the given second optical signal.

In some embodiments of method 500 there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
    a first mirror configured to at least partially reflect a first optical signal having multiple wavelengths;
    a first optical waveguide optically coupled to the first mirror, configured to convey the first optical signal;
    a wavelength-control device, wherein the wavelength-control device includes:
        a first optical port configured to couple to the first optical waveguide;
        a propagation region configured to convey the first optical signal;
        an optical device configured to image and diffract the first optical signal using a reflective geometry in one propagation direction, and to image and diffract second optical signals having the wavelengths using the reflective geometry in another propagation direction, wherein a given second optical signal has a given wavelength; and
        second optical ports, optically coupled to diffraction orders of the optical device, configured to convey the second optical signals having the wavelengths, wherein a given second optical port provides the given second optical signal; and
    optical paths, optically coupled to the second optical ports, including second optical waveguides configured to convey the second optical signals, optical gain mechanisms configured to amplify the second optical signals, and second mirrors configured to at least partially reflect the second optical signals.

2. The optical source of claim 1, wherein a given optical path includes:
    a given second optical waveguide optically coupled to a given second optical port, configured to convey the given second optical signal;
    a given optical gain mechanism, optically coupled to the given second optical waveguide, configured to amplify the given second optical signal; and
    a given second mirror, optically coupled to the given second optical waveguide, configured to at least partially reflect the given second optical signal.

3. The optical source of claim 1, wherein the optical paths further include optical phase-tuning mechanisms; and
    wherein a given optical phase-tuning mechanism is optically coupled to the given second optical waveguide and is configured to adjust a phase of the given second optical signal.

4. The optical source of claim 3, wherein the optical phase-tuning mechanisms have a different band gap than that of the optical gain mechanisms.

5. The optical source of claim 3, wherein the optical phase-tuning mechanisms include heaters configured to modify temperatures of the optical phase-tuning mechanisms.

6. The optical source of claim 1, wherein the first mirror includes a distributed Bragg reflector; and
    wherein the second mirrors include distributed Bragg reflectors.

7. The optical source of claim 1, wherein the first mirror includes a metal disposed on a surface of the first optical waveguide; and
    wherein the second mirrors include metal disposed on surfaces of the second optical waveguides.

8. The optical source of claim 1, wherein the optical gain mechanisms are configured to receive electrical currents to electrically pump the second optical signals.

9. The optical source of claim 1, wherein the optical source is configured to output the first optical signal at the first mirror.

10. The optical source of claim 9, further comprising cascaded ring-resonator modulators, optically coupled to the first mirror, configured to modulate the wavelengths in the first optical signal.

11. The optical source of claim 1, wherein the optical source is configured to output the second optical signals at the second mirrors.

12. The optical source of claim 11, further comprising optical modulators, optically coupled to the second mirrors, configured to modulate the wavelengths in the second optical signals.

13. The optical source of claim 1, wherein an incidence angle associated with a given diffraction order of the optical device is different than a diffraction angle associated with the given diffraction order.

14. The optical source of claim 1, wherein the optical device includes a diffraction grating on a curved surface.

15. The optical source of claim 1, wherein the optical device includes an echelle grating.

16. An optical source, comprising:
    a substrate;
    a buried-oxide layer disposed on the substrate;
    a semiconductor layer disposed on the buried-oxide layer;
    a first mirror configured to at least partially reflect a first optical signal having multiple wavelengths;
    a first optical waveguide disposed in the semiconductor layer and optically coupled to the first mirror, configured to convey the first optical signal;
    a wavelength-control device, wherein the wavelength-control device includes:

a first optical port configured to couple to the first optical waveguide;

a propagation region configured to convey the first optical signal;

an optical device configured to image and diffract the first optical signal using a reflective geometry in one propagation direction, and to image and diffract second optical signals having the wavelengths using the reflective geometry in another propagation direction, wherein a given second optical signal has a given wavelength; and second optical ports, optically coupled to diffraction orders of the optical device, configured to convey the second optical signals having the wavelengths, wherein a given second optical port provides the given second optical signal; and optical paths, optically coupled to the second optical ports, including second optical waveguides, disposed in the semiconductor layer, configured to convey the second optical signals, optical gain mechanisms configured to amplify the second optical signals, and second mirrors configured to at least partially reflect the second optical signals.

17. The optical source of claim 16, wherein the substrate includes a semiconductor.

18. The optical source of claim 16, wherein the wavelength-control filter is included in the semiconductor layer.

19. The optical source of claim 16, wherein the optical gain mechanisms include at least a different semiconductor than that in the semiconductor layer.

20. A method for amplifying optical signals, wherein the method comprises:

using a first mirror, at least partially reflecting a first optical signal having multiple wavelengths;

conveying the first optical signal in a first optical waveguide;

in one propagation direction, imaging and diffracting the first optical signal using an optical device in a wavelength-control device to de-multiplex the first optical signal into second optical signals having the wavelengths, wherein a given second optical signal has a given wavelength;

in another propagation direction, imaging and diffracting the second optical signals using the optical device to multiplex the second optical signals into the first optical signal;

conveying the second optical signals in second optical waveguides, wherein a given second optical waveguide conveys a given second optical signal;

amplifying the second optical signals using optical gain mechanisms optically coupled to the second optical waveguides, wherein a given optical gain mechanism amplifies the given second optical signal; and at least partially reflecting the second optical signals using second mirrors, wherein a given second mirror at least partially reflects the given second optical signal.

* * * * *